(12) United States Patent
Veeder

(10) Patent No.: US 8,981,437 B2
(45) Date of Patent: Mar. 17, 2015

(54) WIDE BIAS BACKGROUND SUBTRACTION PIXEL FRONT-END WITH SHORT PROTECTION

(71) Applicant: Kenton Veeder, Santa Barbara, CA (US)

(72) Inventor: Kenton Veeder, Santa Barbara, CA (US)

( * ) Notice: Subject to any disclaimer, the term of this patent is extended or adjusted under 35 U.S.C. 154(b) by 119 days.

(21) Appl. No.: 13/678,269

(22) Filed: Nov. 15, 2012

(65) Prior Publication Data

US 2014/0131778 A1  May 15, 2014

(51) Int. Cl.
  H01L 21/00    (2006.01)
  H01L 31/02    (2006.01)
  H01L 27/146   (2006.01)
(52) U.S. Cl.
  CPC .... H01L 31/02019 (2013.01); H01L 27/14609 (2013.01)
  USPC ............................ 257/292; 257/290; 250/216
(58) Field of Classification Search
  USPC .................................. 257/290, 292; 250/216
  See application file for complete search history.

(56) References Cited

U.S. PATENT DOCUMENTS

| | | | |
|---|---|---|---|
| 7,372,392 B1* | 5/2008 | Wan et al. ...................... 341/172 |
| 7,385,426 B1* | 6/2008 | Wan et al. ...................... 326/115 |
| 7,812,755 B2* | 10/2010 | Vampola et al. ............... 341/161 |
| 7,928,355 B2* | 4/2011 | Veeder ........................ 250/214 C |
| 7,968,834 B2* | 6/2011 | Veeder ........................ 250/208.1 |
| 2007/0131992 A1* | 6/2007 | Dosluoglu et al. ............ 257/292 |
| 2008/0136933 A1* | 6/2008 | Dosluoglu et al. ........... 348/223.1 |
| 2010/0072349 A1* | 3/2010 | Veeder ........................ 250/208.1 |
| 2010/0109925 A1* | 5/2010 | Vampola et al. ............... 341/143 |
| 2010/0213352 A1* | 8/2010 | Veeder ............................ 250/214 |
| 2011/0272583 A1* | 11/2011 | Veeder ...................... 250/339.05 |
| 2013/0099103 A1* | 4/2013 | Veeder ............................ 250/216 |
| 2014/0131778 A1* | 5/2014 | Veeder ............................ 257/290 |

* cited by examiner

*Primary Examiner* — Laura Menz
(74) *Attorney, Agent, or Firm* — Mark Rodgers

(57) ABSTRACT

Pixel Front end circuits particularly applicable to photodetectors requiring wide bias ranges and/or with high background currents. In various versions, wide bias ranges, short protection, and background current subtraction, both predetermined and automatically sampled, are disclosed.

6 Claims, 5 Drawing Sheets

WIDE BIAS BACKGROUND SUBTRACTION PIXEL FRONT-END WITH SHORT PROTECTION

FEDERALLY SPONSORED RESEARCH

This invention was made with Government support under W911QX-11-C-0096 awarded by the US ARMY. The Government has certain rights in the invention.

RELATED APPLICATIONS

Not Applicable

SEQUENCE LISTING

Not Applicable

BACKGROUND OF THE INVENTION

The invention relates to pixel front ends, primarily in readout devices for photodetector arrays and in particular to systems where the photodetectors require a wide bias voltage range and have high background currents, or both.

Many semiconductor photonic detectors (especially II-VI and III-V materials) operated in photoconductive mode must have voltage biases held relatively constant across their semiconductor junctions in order to maintain good linearity of a generated photocurrent, which is proportional to the incoming signal. Typically, this voltage bias will be applied to the detector junction by providing one common voltage to the detector substrate directly (called detector common) and one bias through a CMOS readout pixel. These CMOS readout pixels are typically implemented in an array format to create staring image sensors. There are several methods of applying this detector bias in CMOS circuitry. Active amplifiers with feedback are sometimes used in each pixel, such as that in resistive transimpedance amplifiers (RTIAs) or capacitive transimpedance amplifiers (CTIAs). Another popular (and perhaps older) method is through a passive amplifier made out of a single FET transistor, called a direct injection (DI) FET. Today, the direct injection approach is more common for small pixel or megapixel+ format image sensors due to the reduced area of a single transistor bias and the reduced power of a passive amplifier.

There are a number of problems with the typical bias methods provided above. The circuits are susceptible to detector shorts, which can damage the readout CMOS circuitry if the detector bias is high. None of the techniques are able to subtract unwanted dark current or background photocurrent from the incoming detector current without circuit modifications. Furthermore, many of the background subtracting modifications are only good for very high currents or on a global basis.

Many detector materials and/or types need a better solution. Examples such as Quantum Well Infrared Photodetectors (QWIPs), Strained Layer Superlattice (SLS), microfabricated bolometer arrays, or more conventional detectors operated at higher temperatures all have needs for a higher possible detector bias, larger possible detector current, dead short protection to protect the readout from individual bad detector elements, and some form of background subtracting charge skimming. Other detector materials may have similar needs, especially those containing photoconductive gain or very weak diode characteristics (low impedance reverse bias). High background current in particular is a driving force requiring many IR detector systems to be operated at cryogenic temperatures, leading to increased expense and complexity, lower reliability and portability, and limited operational life, so that possible operation at higher temperatures is clearly desirable. Thus it is the object of this invention to provide a pixel front end that in various embodiments can provide correction for high background currents, wide bias range and/or short protection, as well as other benefits which will become apparent in the following disclosure.

BRIEF SUMMARY OF THE INVENTION

In one embodiment, the invention is a method for wide detector bias capability and detector short protection for a pixel front end for at least one photodetector, including the steps of; connecting one p-type device and one n-type device with their channels in serial between one terminal of the detector, and a voltage mode pixel backend, and selectively depending on detector type, using one device as a switch, and the other as a direct injection device with the detector bias set by the gate voltage, on the direct injection device. In certain embodiments, if the photodetector requires a positive bias, from connection to circuit to common node, the device directly connected to the detector is used as a p-type switch and the second device is used as an n-type direct injection device, and if the photodetector requires a negative bias, from connection to circuit to common node, the device directly connected to the detector is used as a p-type direct injection device and the second device is used as a n-type switch. For the case where the p-type device is a switch, the maximum bias voltage range and the protection from detector shorts is increased to the sum of maximum gate oxide voltage of the device fabrication process and the source voltage of the second device with respect to its bulk. In a preferred embodiment, the p-type device is a laterally-diffused metal oxide semiconductor (LDMOS) device.

In another embodiment, the invention is a pixel front end for interfacing to at least one photodetector having a first terminal and a second terminal connected to a detector common, including a p-type device with one end of its channel connected to the first terminal of the photodetector, and an n-type device with one end of its channel connected serially to the channel of the p-type device and the second end connected to a voltage mode pixel backend. If the photodetector requires a positive bias, from connection to circuit to common node, the p-type device is used as a p-type switch and the n-type device is used as an n-type direct injection device, and if the photodetector requires a negative bias, from connection to circuit to common node, the p-type device is used as a p-type direct injection device and the n-type device is used as a n-type switch. The p-type device is preferably an LDMOS device.

In another embodiment, the invention is a pixel front end for interfacing to at least one photodetector having a first terminal and a second terminal connected to a detector common, including; an n-type device acting as a direct injection device, with one end of its channel connected to the first terminal of the photodetector and the other end of its channel connected to a voltage mode pixel backend, and the gate signal applied to the device sets the bias across the detector, a p-type current source connected between the detector first terminal and another common, acting to reduce current to the direct injection device; and a first p-type switch whose channel is connected between the gate of the current source and an external voltage. A signal applied to the gate of the p-type switch applies the external voltage to the gate of the current source where it is held by inherent gate capacitance after p-type switch is turned off, thereby setting a fixed amount of current subtracted from injection where the external voltage may be determined on a pixel by pixel basis to subtract out measured background current. The embodiment may include another p-type switch whose channel is connected between the detector first terminal and the channel of the direct injection device, wherein the second p-type switch is normally turned fully on and acts to widen the bias range on the detector and provide detector short protection. The second p-type switch is preferably an LDMOS device.

In another embodiment the invention is a pixel front end for interfacing to at least one photodetector having a first terminal and a second terminal connected to a detector common, including; an n-type device acting as a direct injection device, with one end of its channel connected to the first terminal of the photodetector and the other end of its channel connected to a voltage mode pixel backend, and the gate signal applied to the device sets the bias across the detector, a p-type current source connected between the detector first terminal and another common, acting to reduce current to the direct injection device, and a first p-type switch, connected across the current source from gate to drain, wherein the first p-type switch is turned on during a calibration period, thereby sampling the gate signal on the current source related to the current flow during calibration (background current), such that when the first p-type switch is turned off, the sampled voltage is held on the gate of the current source causing the background current to be subtracted from injection. Also included is an n-type current sink connected with its channel as a current sink between the first terminal of the detector and another common and its gate connected to an external bias voltage, and when properly biased, the n-type current sink will apply a predetermined compensation current to be added to the sampled background current of the proper magnitude whereby when the p-type switch and n-type current source are switched off in consecutive order before image collection begins, the resulting background current continues to flow through the p-type current source due to the held values on its gate capacitance and is compensated to remove the effects of charge injection pedestal error from the p-type switch shutting off. The embodiment optionally includes a second p-type switch whose channel is connected between the detector first terminal and the injection channel, wherein the second p-type switch device is normally turned fully on and acts to widen the bias range on the detector and provide detector short protection. The second p-type switch is preferably an LDMOS device. An optional third p-type switch whose channel is connected between the gate of the current source and an external voltage, wherein turning on the third p-type switch applies the external voltage to the gate of the current source where it is held by inherent gate capacitance when the third p-type switch is turned off, thereby setting a fixed amount of current subtracted from injection where the external voltage may be determined on a pixel by pixel basis to subtract out predetermined background current. In other versions the invention may include a third p-type switch whose channel is connected between the gate of the current source and an external voltage, wherein turning on the third p-type switch applies the external voltage to the gate of the current source where it is held by inherent gate capacitance when the third p-type switch is turned off, thereby setting a fixed amount of current subtracted from injection where the external voltage may be determined on a pixel by pixel basis to subtract out predetermined background current.

In another embodiment, the invention may also include an n-type device connected in cascode between the injection signal and the current sink, a first n-type switch connected the across the current sink from drain to gate, and a second n-type switch connected from the gate of the current source to a common bias voltage wherein;

The second p-type switch and n-type injection devices may be complementary and alternatively used as switches/short protection and directly injection depending on the type of photodetector The current sink or source be may used for either direct application of a background subtraction control signal and/or compensation current control signal via either the second n-type switch or third p-type switch depending on type of photodetector Depending on type of photodetector either the second n-type switch or the first p-type switch may be used to sample and hold a measured background current control signal.

BRIEF DESCRIPTION OF THE DRAWINGS

The invention will be better understood by referring to the following figures.

DETAILED DESCRIPTION OF THE INVENTION

Figure 1:
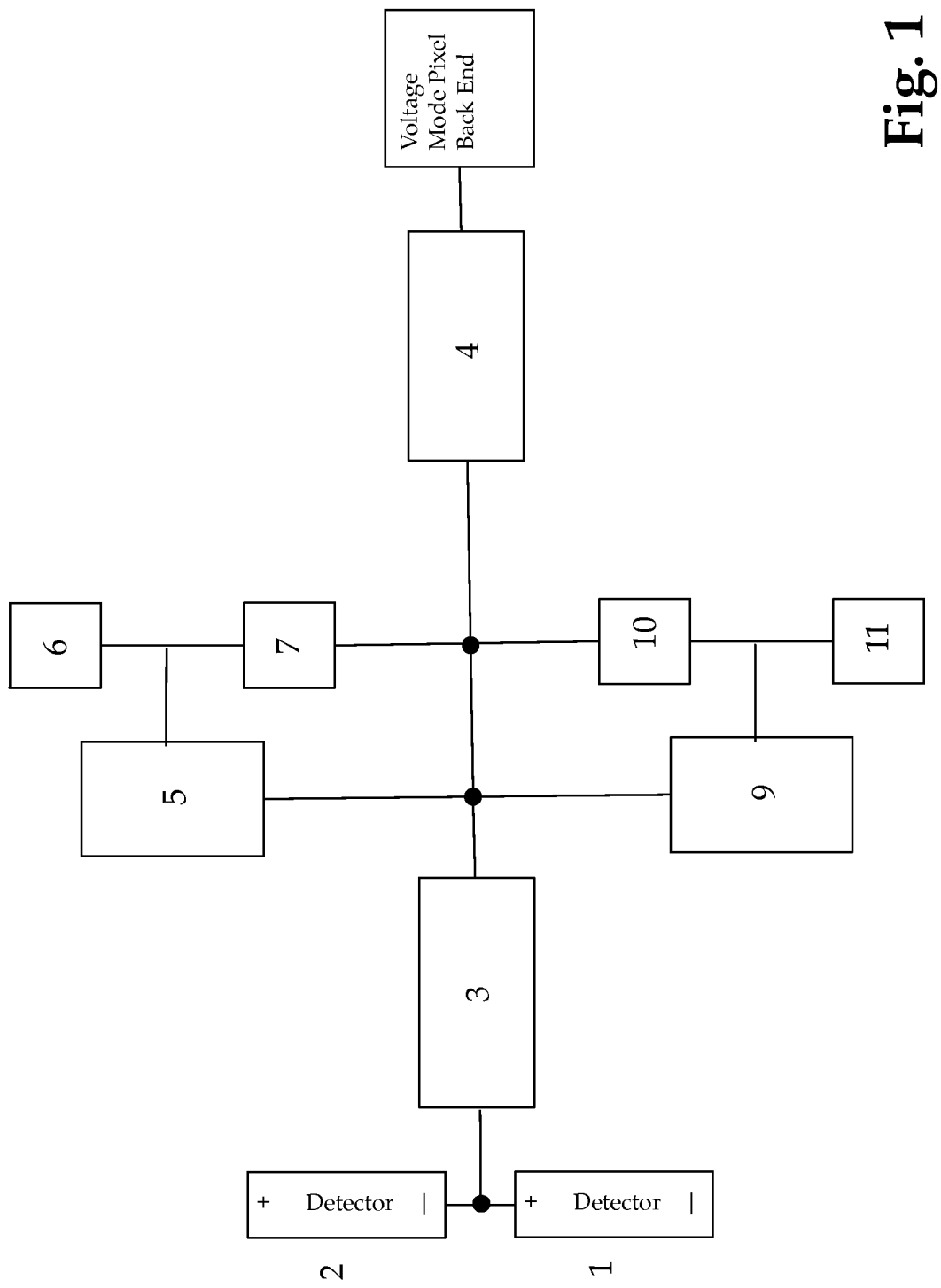
FIG. 1 shows the invention in block diagram form

The invention is a pixel front end for a photodetector. Although the invention applies to a variety of system configurations, it is most applicable to applications involving arrays of photodetectors such as imaging systems for example, where the photodetector array is typically interfaced to readout electronics containing elements dedicated on a per pixel basis as well as elements for accessing and reading out pixel data into manageable data streams. Such systems are known in the infrared and visible imaging art. Thus the invention is a pixel front end, part of the per pixel dedicated elements, and typically will interface between a photodetector and a voltage mode pixel back end. The invention is intended to achieve one or more of the following objectives, depending on the system application;

Wider photodetector bias range than typically available with existing front end designs Protection from photodetector shorts Correction capability for photodetector operating conditions that have high background currents Operation for both positive and negative biased photodetectors, and potential operation of both from a single front end circuit FIG. 1 shows the invention implemented to achieve all of the objectives in block diagram form. FIG. 1 shows both detector types, positive bias 1 and negative bias 2 connected simultaneously to two elements in parallel 3 and 4, which depending on type of detector act as either a direct injection photodetector buffer, known in the art, or as a switch. Current source with background correction capability elements 5, 6 and 7, along with current sink with background correction devices 9, 10, and 11 act together, as will be shown to achieve the above objectives. One skilled in the art will readily appreciate that for a non-dense application such as a single pixel or small number of pixels, the functions shown by the various elements in FIG. 1 could be implemented in a variety of ways. However for the preferred application of the invention where the per pixel elements of the readout electronics are often constrained to fit within the pixel area, the only way to practically implement such circuits is as elements in a microfabricated integrated circuit. Such circuits are typically CMOS processes and modern detector arrays are sufficiently dense that packing the per pixel elements into the allocated area pushes the design rules for the fabrication processes. Thus the device types available for such analog circuit designs consist of p-type or n-type MOSFETs and as few as possible need to be used to achieve the desired functionality. Therefore the remaining figures all show arrangements of p and n type MOSFETs with the ordering and placement of each type being important, and utilize the parasitic attributes of the processing such as inherent gate capacitance to achieve the desired functionality. However one skilled in the art will understand that the basic teachings could be implemented with other approaches for applications where the packing density and/or design rules permit a larger number of devices and circuit elements to be employed.

Figure 2:
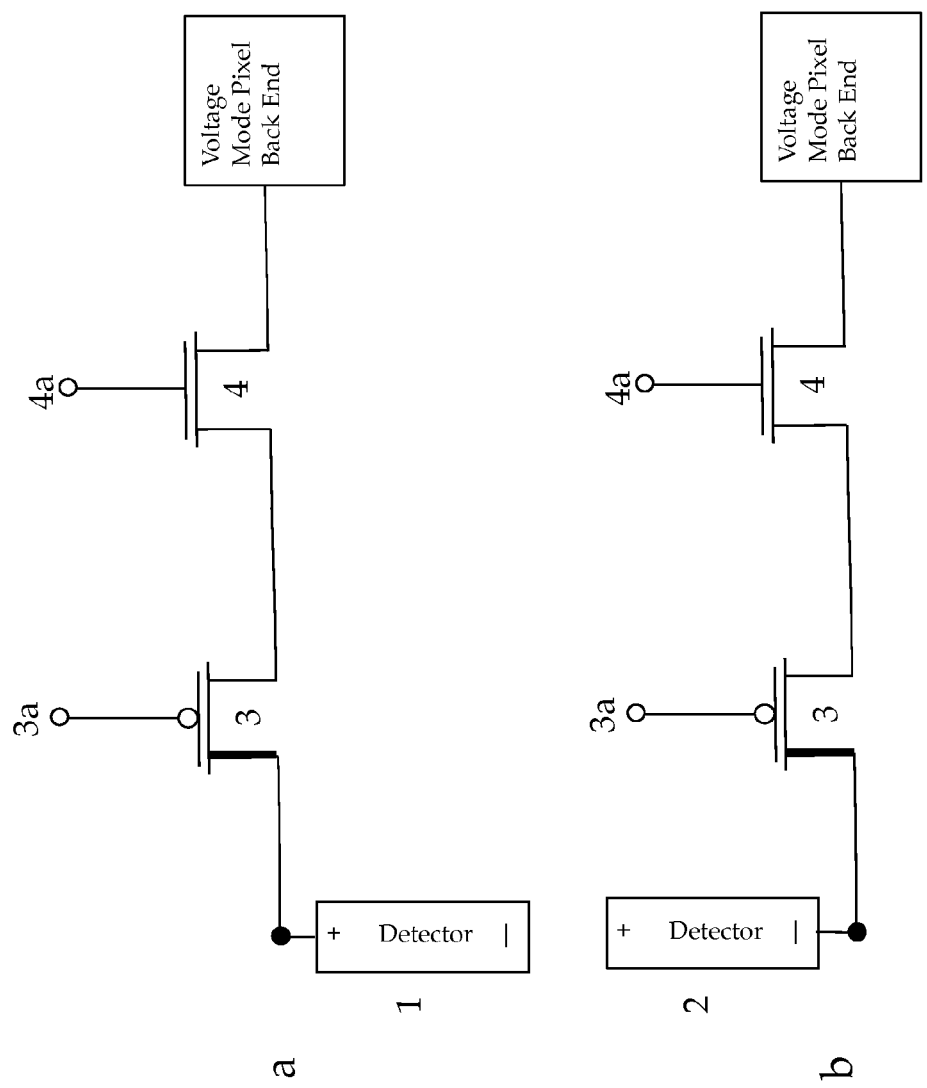
FIG. 2 shows the invention with wide bias and short protection.

Detailed descriptions of each part of the novel front end are shown in FIGS. 2-5, specifically for the case of area constrained CMOS processing. FIG. 2 illustrates the wide bias range and short protection aspects of the invention. P-type device 3 and n-type device 4 may be used either to bias and buffer detectors 1 and 2 by direct injection, or as switches depending on the type of detector. Thus in FIG. 2 (a), for a positive bias detector 1, 4 is the direct injection device and 3 is configured as an always on switch. Thus the bias across the photodetector is set by gate signal 4a and gate signal 3a is chosen to keep device 3 on. Device 3 allows the maximum detector bias voltage to be much larger and automatically protects the circuit from shorted detector elements. The normal limit for detector bias voltage range is set by the maximum voltage possible across the CMOS process gate oxide for long term reliability. If a short exists in the detector array, as is often the case, the detector common cannot drop below the gate oxide voltage limit of the direct injection bias voltage applied at 4a without risking damage to the rest of the array itself through shorting the detector common to the direct injection bias voltage at 4a. This limits the maximum possible detector bias voltage to be one sub-threshold Vgs drop less than the process maximum gate voltage. Device 3 increases the maximum detector bias voltage because its gate sits at 0 V, so the detector common may be dropped a full additional maximum gate voltage, bringing the maxim detector bias voltage one sub-threshold Vgs less than two times the maximum process gate voltage. A worst-case dead-short detector element will drop the drain of device 3 down to the detector common voltage and begin to pull the source, connected to device 4, down as well. This will move device 3 into sub-threshold and then off as the source approaches the gate bias at 3a. In this way, device 4, or any other circuits behind device 3 are automatically protected from detector shorts and, furthermore, the shorted current dumping to the detector common is quite low, limited only by the charge that is allowed to flow through device 3 during reset conditions. For a negatively biased detector 2 the roles of 3 and 4 are reversed, as shown in FIG. 2 (b). In this case, the maximum detector bias voltage is the same as that in a conventional implementation, which is one sub-threshold Vgs drop less than the process maximum gate voltage. As one skilled in the art will recognize, both types of detectors could be connected in series and could be switched in and out because, depending on which of 3 or 4 was used as the injection device, one of the detectors would be forward biased and effectively turned off or produce a minimal change in output current versus its photonic input.

If device 3 is chosen to be a Laterally Diffused MOS (LDMOS) device, compatible with current processing capabilities, the gate to drain voltage achievable is much higher than for conventional MOS devices. Thus if 3 is an LDMOS device indicated by the dark line on one leg of the device, both much wider bias and short protection is achieved for the positive detector bias configuration shown in FIG. 2 (a). The circuit now exhibits a maximum possible detector bias of one sub-threshold Vgs less than one normal process maximum gate voltage plus one LDMOS maximum gate-to-drain voltage, which can be many times higher than with conventional devices. For example, referring to FIG. 2 (a), if device 3 is a 15 V compatible LDMOS device and if the detector minus voltage is set at −15 V and the gate of 3 is set to 0 V, 3 is turned on and acts as a closed switch as long as device 3's gate to source voltage exceeds its threshold, as set by device 4. Device 4 will hold the bias voltage constant across the detector and allow the integration nodes in the pixel back-end to swing. The maximum limit to the detector bias if very little swing is allocated to the pixel back-end is then 15 V+Vs_4, or about 17.8 V, if device 4 is a 3.3 V transistor. One skilled in the art will recognize that this is the absolute maximum detector bias voltage and a real system would no doubt need to provide more room for the pixel voltage mode back-end to swing, dropping the maximum detector bias voltage down to around 16 V.

Figure 3:
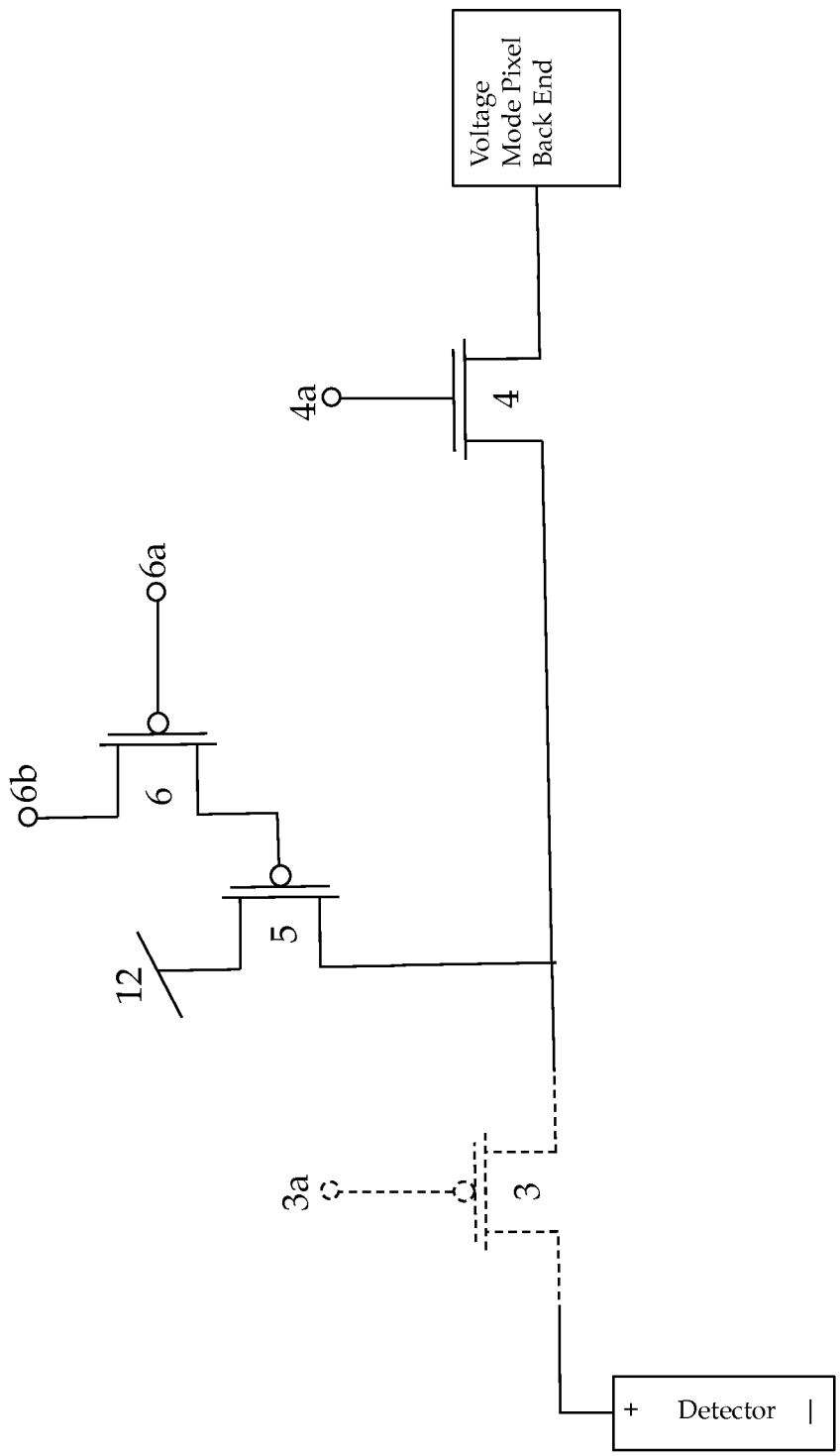
FIG. 3 shows the invention configured for predetermined background current subtraction and optional wide bias/short protection.
Figure 4:
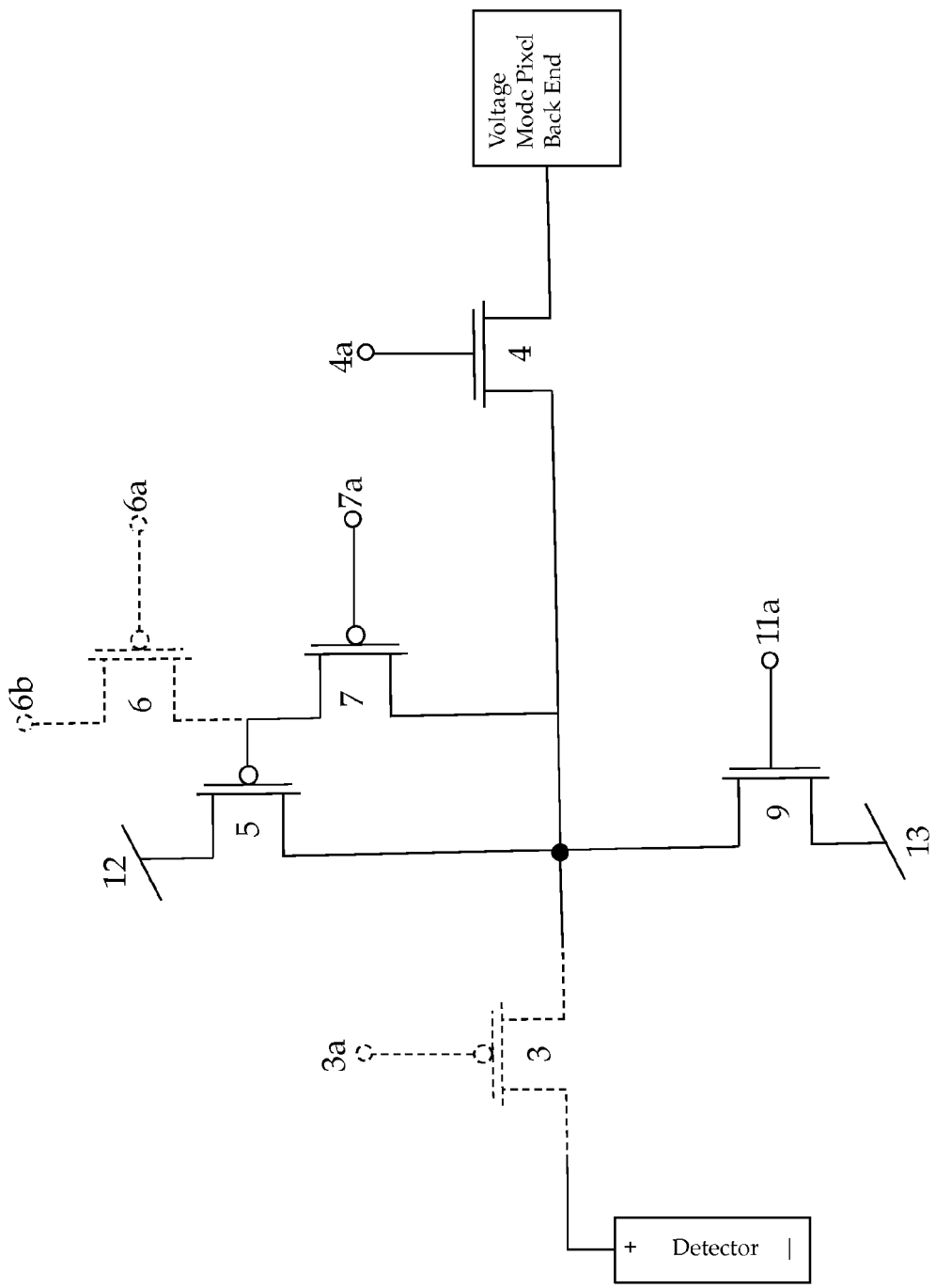
FIG. 4 shows the invention configured for automatic compensated background current subtraction and optional predetermined background subtraction and wide bias/short protection.

FIG. 3 illustrates an approach to doing background current subtraction. The Figure is shown for the case where detector 1 is a positive bias detector. During a calibration period in the operation of the photodetector array, for example for an imaging system, when a shutter is closed, the current flowing out of n-type direct injection device 4 is the background current or dark current of the detector. FIG. 4 illustrates a compensation based on a predetermined knowledge or estimate of what this background current is. During a non-imaging period, p-type switch 6 is switched on applying the voltage 6b onto the gate of current source 5, basically engaging 5 to subtract a predetermined amount of current from injection device 4. Voltage 6b can either be chosen as a single voltage across the whole array, or it can be a pixel specific voltage determined by measurement or calibration. In either case, when 6 is turned off voltage 6b will be held on the gate of 5 by the inherent gate capacitance, thus causing the subtraction current to continue to flow during actual imaging operation of the system, during which time 6 is off. Device 3 may also be present to provide the wide bias and short protection function FIG. 4 illustrates an automatic background subtraction approach. During a calibration cycle, such as shutter closed, the current flow out of 4 will be the background current of detector 1. P-type device 7 is configured as a switch across the gate-drain of current source 5, thereby configuring 5 as a diode-connected MOSFET through which the background current flows. This effectively acts to set the gate of 5 at the proper voltage for that flow. Thus when 7 is turned off, the gate voltage is held by the gate capacitance and the actual per pixel background current is subtracted from injection. One skilled in the art will recognize that this technique is most useful for large background currents and does not work well when background currents are very small. When device 7 is turned off it will inject positive charge onto the gate of 5, which will reduce the sampled gate voltage and thereby reduce the resultant current. For cases where the background current is very low and 5 is in deep sub-threshold operation, this charge injection can be a serious effect because the output current is responding exponentially to changes in the gate voltage, so a small amount of positive charge injection will cause a very large change in the current.

We may compensate for the charge injection effect by utilizing the current sink, 9, to provide an additional compensating current which provides enough extra Vgs drop on 5 to cancel out the voltage rise when positive charge is injected from 7 shutting off. This is done in the following manner. During some initial set-up time, the entire imaging array is switched so the current source, 5, is diode connected using 7 and matches the current flowing through it. The current sink, 9, is set to have some compensation current value. The detector leakage (or background) current is added to the compensation current and this total current initially flows through the current source, 5. The compensation current may be chosen from experimentation or calculated to precisely compensate for the offsets injected onto the gates of the current source transistor when the diode connection switch, 7, opens. After the initial setup time, 7 opens on the gate of 5 and a bias voltage is held on this floating gate, locking in the amount of background current to be subtracted. Device 9 is shut off directly following device 7. The final result is a very accurate compensated background current which is automatically set and then subtracted from the detector background current pulled through 4. This method may be reversed for negative biased detectors using a current source as the offset compensation current generator and a current sink as the subtracted current.

P-type switch 3 could be optionally added for wide bias/short protection and p-type switch 6 could be added to provide the option of predetermined background subtraction in addition to the automated and compensated automated background subtraction.

Figure 5:
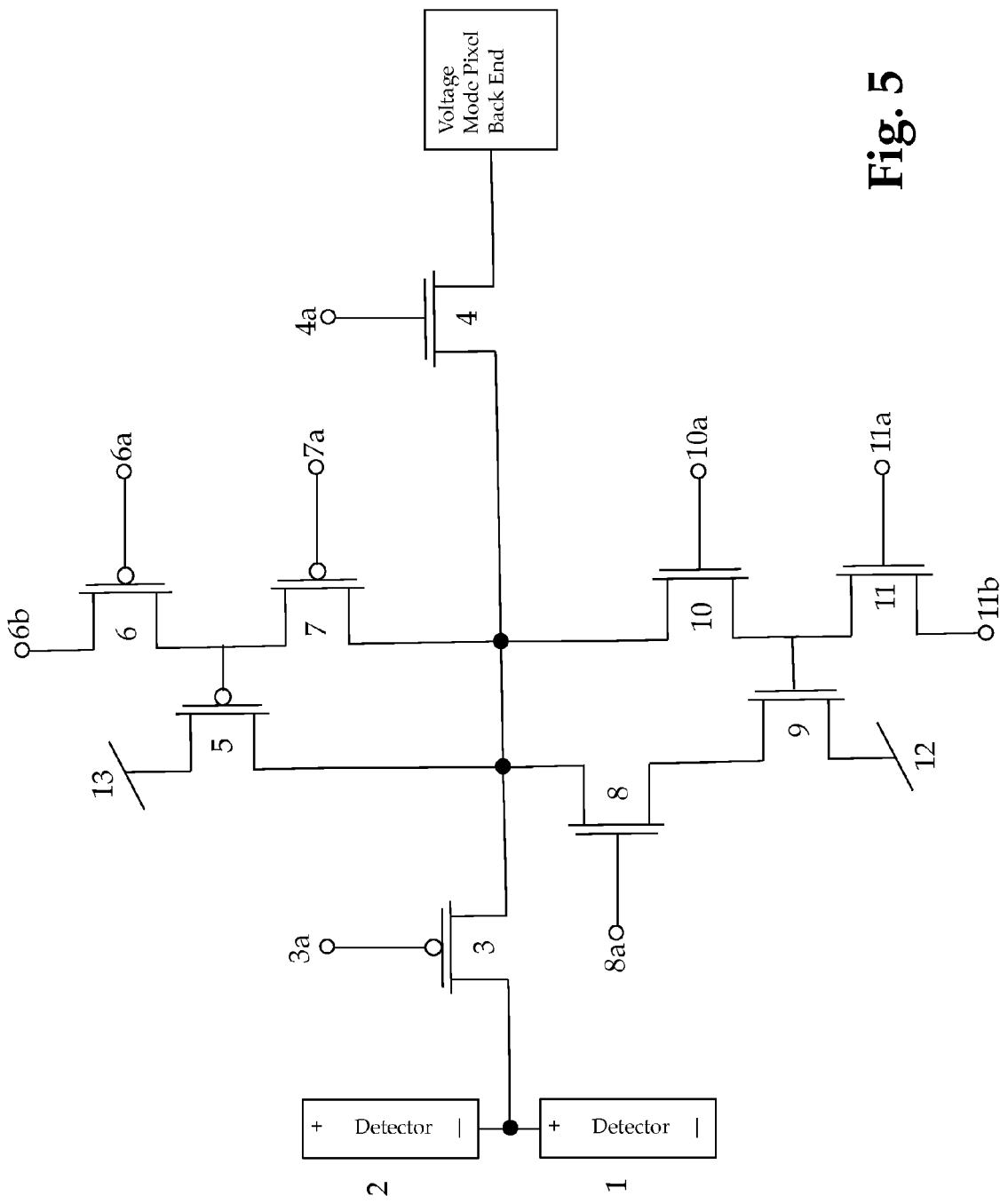
FIG. 5 shows the novel pixel front end with all functions implemented.

FIG. 5 shows the addition of devices that would provide the background subtraction modes for positive bias detectors. N-type switch 11 provides the predetermined subtraction, while n-type switch 10 provides the automatic subtraction diode connection for current sink 9 and 8. Compensation currents would be produced by turning on 5 and 9 respectively through 11 and 6. N-type device 8 is connected in cascode with n-type current sink 9 because when 3 is used as the injection device, the voltage swing at the pixel back end will modify the floating gate voltage on 9 through the parasitic drain to gate capacitance, which will change the current subtracted from the background as a function of pixel back-end voltage. The cascode device, 8, holds the drain voltage relatively constant on 9 and effectively shields 9 from the voltage movement of the pixel backend.

The foregoing description of the embodiments of the present invention has shown, described and pointed out the fundamental novel features of the invention. It will be understood that various omissions, substitutions, and changes in the form of the detail of the systems and methods as illustrated as well as the uses thereof, may be made by those skilled in the art, without departing from the spirit of the invention. Consequently, the scope of the invention should not be limited to the foregoing discussions, but should be defined by appended claims.

I claim:

1. A pixel front end for interfacing to at least one photodetector comprising a first terminal and a second terminal connected to a detector common, comprising;

an n-type device acting as a direct injection device, with one end of its channel connected to the first terminal of the photodetector and the other end of its channel connected to a voltage mode pixel backend, and the gate signal applied to the device sets the bias across the detector, a p-type current source connected between the detector first terminal and another common, acting to reduce current to the direct injection device; and, a first p-type switch, connected across the current source from gate to drain, wherein the first p-type switch is turned on during a calibration period, thereby sampling the gate signal on the current source related to the current flow during calibration (background current), such that when the first p-type switch is turned off, the sampled voltage is held on the gate of the current source causing the background current to be subtracted from injection an n-type current sink connected with its channel as a current sink between the first terminal of the detector and another common and its gate connected to an external bias voltage; and, when properly biased, the n-type current sink will apply a predetermined compensation current to be added to the sampled background current of the proper magnitude whereby when the p-type switch and n-type current source are switched off in consecutive order before image collection begins, the resulting background current continues to flow through the p-type current source due to the held values on its gate capacitance and is compensated to remove the effects of charge injection pedestal error from the p-type switch shutting off.

2. The pixel front end of claim 1 further comprising a second p-type switch whose channel is connected between the detector first terminal and the injection channel, wherein the second p-type switch device is normally turned fully on and acts to widen the bias range on the detector and provide detector short protection.

3. The pixel front end of claim 2 wherein the second p-type switch is an LDMOS device.

4. The pixel front end of claim 1 comprising an optional third p-type switch whose channel is connected between the gate of the current source and an external voltage, wherein turning on the third p-type switch applies the external voltage to the gate of the current source where it is held by inherent gate capacitance when the third p-type switch is turned off, thereby setting a fixed amount of current subtracted from injection where the external voltage may be determined on a pixel by pixel basis to subtract out predetermined background current.

5. The pixel front end of claim 2 comprising an optional third p-type switch whose channel is connected between the gate of the current source and an external voltage, wherein turning on the third p-type switch applies the external voltage to the gate of the current source where it is held by inherent gate capacitance when the third p-type switch is turned off, thereby setting a fixed amount of current subtracted from injection where the external voltage may be determined on a pixel by pixel basis to subtract out predetermined background current.

6. The pixel front end of claim 5 further comprising;

an n-type device connected in cascode between the injection signal and the current sink; and, a first n-type switch connected the across the current sink from drain to gate; and, a second n-type switch connected from the gate of the current source to a common bias voltage wherein;

The second p-type switch and n-type injection devices may be complementary and alternatively used as switches/short protection and direct injection depending on the type of photodetector The current sink or source be may used for either direct application of a background subtraction control signal and/or compensation current control signal via the either the second n-type switch or third p-type switch depending on type of photodetector Depending on type of photodetector either the second n-type switch or the first p-type switch may be used to sample and hold a measured background current control signal.

\* \* \* \* \*